(12) United States Patent
Ohmori et al.

(10) Patent No.: US 12,136,548 B2
(45) Date of Patent: Nov. 5, 2024

(54) LASER ANNEALING APPARATUS, LASER ANNEALING METHOD, AND METHOD FOR MANUFACTURING SEMICONDUCTOR DEVICE

(71) Applicant: JSW AKTINA SYSTEM CO., LTD., Yokohama (JP)

(72) Inventors: Kenichi Ohmori, Tokyo (JP); Suk-Hwan Chung, Tokyo (JP); Ryosuke Sato, Tokyo (JP); Nobuo Oku, Tokyo (JP)

(73) Assignee: JSW AKTINA SYSTEM CO., LTD., Yokohama (JP)

( * ) Notice: Subject to any disclaimer, the term of this patent is extended or adjusted under 35 U.S.C. 154(b) by 0 days.

(21) Appl. No.: 18/538,152

(22) Filed: Dec. 13, 2023

(65) Prior Publication Data

US 2024/0112910 A1 Apr. 4, 2024

Related U.S. Application Data

(62) Division of application No. 17/375,445, filed on Jul. 14, 2021, now Pat. No. 11,894,229.

(30) Foreign Application Priority Data

Jul. 21, 2020 (JP) .................... 2020-124227

(51) Int. Cl.
*H01L 21/268* (2006.01)
*B23K 26/03* (2006.01)
*H01L 21/02* (2006.01)

(52) U.S. Cl.
CPC ...... *H01L 21/02675* (2013.01); *B23K 26/032* (2013.01); *H01L 21/268* (2013.01)

(58) Field of Classification Search
CPC ........... H01L 21/02675; H01L 21/268; B23K 26/032

See application file for complete search history.

(56) References Cited

U.S. PATENT DOCUMENTS 5,956,603 A * 9/1999 Talwar .............. H01L 21/26513
257/E21.336
6,207,493 B1 * 3/2001 Furukawa ............ H01L 21/743
257/E21.538

(Continued)

FOREIGN PATENT DOCUMENTS

JP 2002-359194 A 12/2002
JP 2005-72313 A 3/2005

(Continued)

OTHER PUBLICATIONS

Japanese Office Action dated Feb. 6, 2024 in Application No. 2020-124227.

(Continued)

*Primary Examiner* — Nathan W Ha
(74) *Attorney, Agent, or Firm* — Sughrue Mion, PLLC

(57) ABSTRACT

A laser annealing apparatus according to an embodiment includes a laser light source, an annealing optical system, a linear irradiation region along a Y-direction, a moving mechanism configured to change a relative position of the irradiation region with respect to the substrate along an X-direction, an illumination light source configured to generate illumination light for illuminating the substrate along a third direction, and a detector configured to detect detection light reflected, in a fourth direction, on the substrate illuminated by the illumination light so as to photograph an annealed part of the substrate in a linear field of view along the Y-direction. In a YZ-plane view, the third direction is (Continued)

inclined from the vertical direction and the fourth direction is inclined from the vertical direction.

8 Claims, 16 Drawing Sheets

(56) References Cited

U.S. PATENT DOCUMENTS

| | | | |
|---|---|---|---|
| 7,422,988 B2 | 9/2008 | Adams | |
| 7,438,468 B2* | 10/2008 | Adams | G01J 5/06 |
| | | | 374/129 |
| 8,265,109 B2 | 9/2012 | Das | |
| 8,885,301 B1 | 11/2014 | Heidmann | |
| 9,454,072 B2* | 9/2016 | Levinski | G03F 7/70641 |
| 2003/0016349 A1 | 1/2003 | Tsumura et al. | |
| 2005/0189329 A1* | 9/2005 | Talwar | B23K 26/0604 |
| | | | 219/121.73 |
| 2005/0199596 A1* | 9/2005 | Takami | H01L 22/26 |
| | | | 219/121.65 |
| 2006/0131289 A1* | 6/2006 | Jyumonji | B23K 26/0853 |
| | | | 219/121.65 |
| 2007/0082439 A1* | 4/2007 | Park | H01L 21/823864 |
| | | | 438/231 |
| 2008/0076267 A1* | 3/2008 | Oishi | G02F 1/1368 |
| | | | 438/785 |
| 2008/0192250 A1* | 8/2008 | Yoo | G01N 21/718 |
| | | | 372/24 |
| 2012/0002031 A1 | 1/2012 | Pertsinidis | |
| 2013/0210242 A1 | 8/2013 | Shida | |
| 2013/0341310 A1* | 12/2013 | Van Der Wilt | G01N 21/4788 |
| | | | 219/121.62 |
| 2014/0070119 A1 | 3/2014 | Huang | |
| 2014/0221239 A1 | 8/2014 | Carman | |
| 2014/0264045 A1 | 9/2014 | Marcheschi | |
| 2014/0354969 A1 | 12/2014 | Elings | |
| 2015/0008952 A1* | 1/2015 | Lagowski | H02S 50/10 |
| | | | 324/761.01 |
| 2015/0062590 A1 | 3/2015 | Bagherinia | |
| 2015/0064837 A1 | 3/2015 | Forrest | |
| 2015/0069045 A1 | 3/2015 | Coursey | |
| 2015/0247808 A1* | 9/2015 | Van Der Wilt | G01N 21/4788 |
| | | | 356/237.5 |
| 2016/0252565 A1 | 9/2016 | Marinskiy | |
| 2016/0327485 A1* | 11/2016 | Kiss | G01N 21/9505 |
| 2017/0117148 A1* | 4/2017 | Xu | H01L 27/1218 |
| 2017/0184981 A1 | 6/2017 | Quintanilha | |
| 2017/0315456 A1* | 11/2017 | Lin | H01S 3/1625 |
| 2017/0322497 A1 | 11/2017 | Lin | |
| 2017/0357155 A1* | 12/2017 | Quintanilha | G03F 7/2004 |
| 2018/0111222 A1* | 4/2018 | Yamashita | B23K 26/0732 |
| 2019/0049861 A1* | 2/2019 | Van Voorst | G03F 7/70616 |
| 2019/0096684 A1* | 3/2019 | Peck | H01J 37/32 |
| 2019/0267240 A1* | 8/2019 | Ohmori | H01L 22/12 |
| 2019/0326140 A1* | 10/2019 | Chung | B23K 26/1464 |
| 2020/0100350 A1* | 3/2020 | Van Voorst | G01N 21/956 |
| 2021/0285898 A1* | 9/2021 | Dikopoltsev | G01B 15/00 |
| 2021/0397172 A1* | 12/2021 | Slachter | G05B 19/4188 |
| 2022/0118454 A1* | 4/2022 | Chiu | C12Q 1/6844 |
| 2022/0184734 A1* | 6/2022 | Ohmori | H01L 21/268 |
| 2022/0331910 A1* | 10/2022 | Ohmori | B23K 26/705 |

FOREIGN PATENT DOCUMENTS

| | | |
|---|---|---|
| JP | 2006-19408 A | 1/2006 |
| JP | 2012-119512 A | 6/2012 |
| JP | 2018-64048 A | 4/2018 |
| WO | 2018/037756 A1 | 3/2018 |

OTHER PUBLICATIONS

Japanese Office Action dated Jul. 2, 2024 in Application No. 2020-124227.

* cited by examiner

LASER ANNEALING APPARATUS, LASER ANNEALING METHOD, AND METHOD FOR MANUFACTURING SEMICONDUCTOR DEVICE

INCORPORATION BY REFERENCE

This application is a Divisional application of U.S. patent application Ser. No. 17/375,445 filed Jul. 14, 2021, which is based upon and claims the benefit of priority from Japanese patent application No. 2020-124227, filed on Jul. 21, 2020, the disclosure of which is incorporated herein in its entirety by reference.

BACKGROUND

The present disclosure relates to a laser annealing apparatus, a laser annealing method, and a method for manufacturing a semiconductor device.

International Patent Publication No. WO2018/37756 discloses a laser annealing apparatus for forming a polycrystalline silicon thin film. In International Patent Publication No. WO2018/37756, a projection lens concentrates laser light over a substrate so that the laser light forms a linear irradiation region. In this way, an amorphous silicon film is crystallized and becomes a polysilicon film.

Further, in International Patent Publication No. WO2018/37756, the substrate is illuminated by probe light. A detector detects the probe light that has passed through the silicon film. In this way, it is possible to evaluate variations in the crystalline state of the polysilicon film.

SUMMARY

In such a laser irradiation apparatus, it is desired to evaluate unevenness of the irradiation of the laser light more accurately.

Other problems and novel features will be clarified from the description of this specification and the attached drawings.

According to an embodiment, a laser annealing apparatus includes: a laser light source configured to generate laser light; an annealing optical system configured to guide the laser light to a substrate so as to form, over the substrate, a linear irradiation region along a first direction in a top view; a moving mechanism configured to change a relative position of the irradiation region with respect to the substrate along a second direction intersecting the first direction in the top view; an illumination light source configured to generate illumination light for illuminating the substrate along a third direction, the third direction being a direction inclined from a vertical direction as viewed in a direction perpendicular to a plane including the first direction and the vertical direction; and a detector configured to detect detection light reflected in a fourth direction by the substrate illuminated by the illumination light so as to photograph an annealed part of the substrate in a linear field of view along the first direction, the fourth direction being inclined from the vertical direction as viewed in the direction perpendicular to the plane including the first direction and the vertical direction.

According to an embodiment, a laser annealing method includes the steps of: (a) generating laser light using a laser light source; (b) guiding the laser light to a substrate so as to form, over the substrate, a linear irradiation region along a first direction in a top view; (c) changing a relative position of the irradiation region with respect to the substrate along a second direction intersecting the first direction in the top view; (d) generating illumination light for illuminating the substrate along a third direction by using an illumination light source, the third direction being a direction inclined from a vertical direction as viewed in a direction perpendicular to a plane including the first direction and the vertical direction; and (e) detecting, by a detector, a detection light reflected in a fourth direction by the substrate illuminated by the illumination light so as to photograph an annealed part of the substrate in a linear field of view along the first direction, the fourth direction being inclined from the vertical direction as viewed in the direction perpendicular to the plane including the first direction and the vertical direction.

According to the embodiment, it is possible to evaluate unevenness of irradiation more accurately. The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

First Embodiment

A laser annealing apparatus according to this embodiment is, for example, an ELA (Excimer Laser Anneal) apparatus that forms an LTPS (Low Temperature Poly-Silicon) film. A laser annealing apparatus, a laser annealing method, and a method for manufacturing a semiconductor device according to this embodiment will be described hereinafter with reference to the drawings.

(Optical System of ELA Apparatus)

Figure 1:
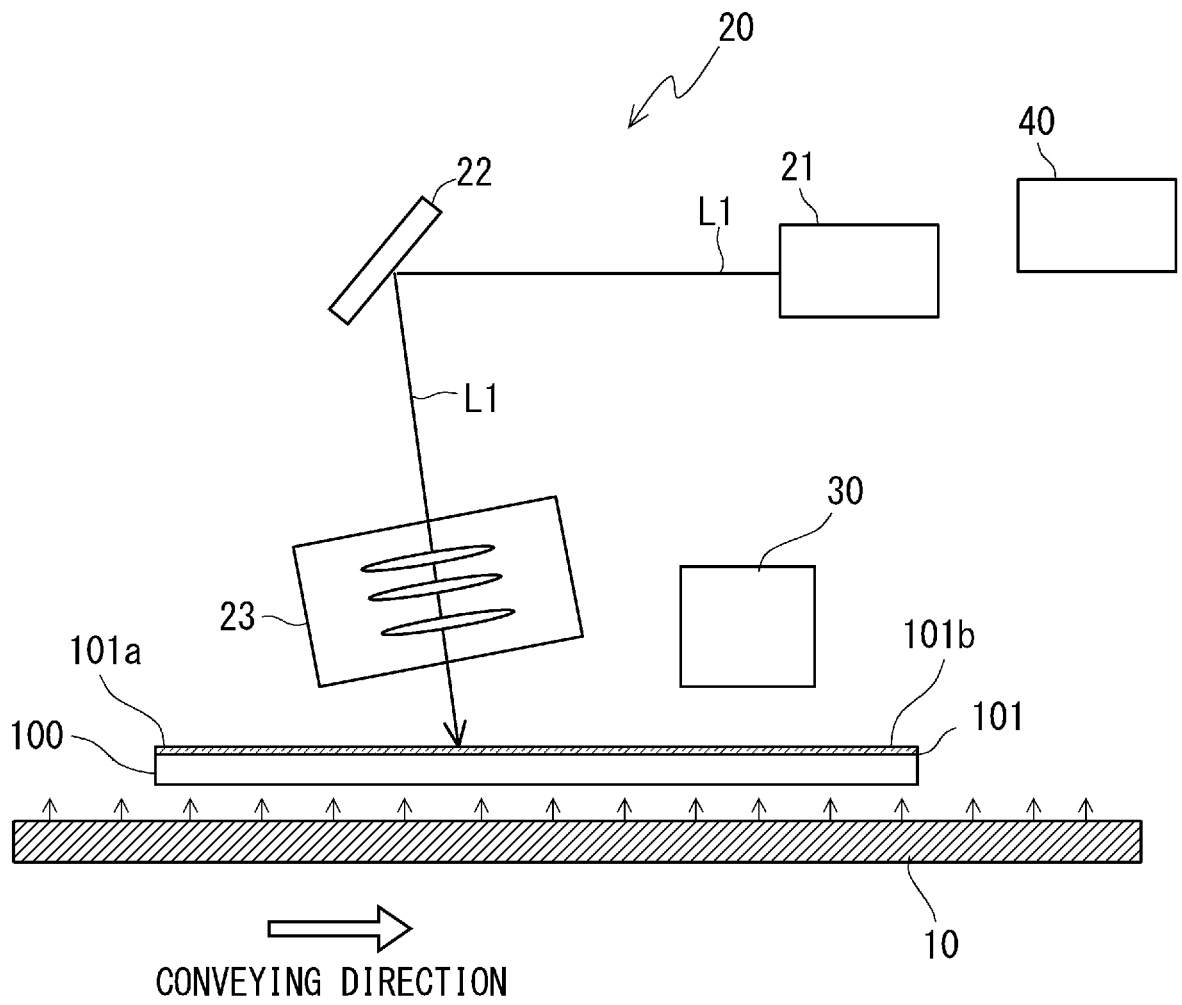
FIG. 1 shows an optical system of a laser annealing apparatus according to an embodiment.

A configuration of an ELA apparatus 1 according to the present embodiment will be described with reference to FIG. 1. FIG. 1 schematically shows an optical system of the ELA apparatus 1. A silicon film 101 is formed over the upper surface (the main surface) of a substrate 100. The ELA apparatus 1 irradiates the silicon film 101 formed over the substrate 100 with laser light L1. In this way, it is possible to convert an amorphous silicon film (a-Si film) 101 into a poly-crystalline silicon film (polysilicon film: p-Si film) 101. The substrate 100 is, for example, a transparent substrate such as a glass substrate.

Note that, an XYZ three-dimensional orthogonal coordinate system is shown in FIG. 1 to clarify the description. The Z-direction is the vertical direction and perpendicular to the substrate 100. The XY-plane is a plane parallel to the surface of the substrate 100 over which the silicon film 101 is formed. The X-direction is the longitudinal direction of the rectangular substrate 100, and the Y-direction is the lateral direction of the substrate 100. Further, in the ELA apparatus 1, the silicon film 101 is irradiated with the laser light L1 while the substrate 100 is conveyed in the X-axis positive direction by a conveying mechanism (not shown in FIG. 1). Note that, in FIG. 1, the silicon film 101 that has not yet been irradiated with the laser light L1 is referred to as an amorphous silicon film 101a, and the silicon film 101 that has already been irradiated with the laser light L1 is referred to as a polysilicon film 101b.

The ELA apparatus 1 includes a stage 10, a laser light source 21, an annealing optical system 20, a detection unit 30, and a control unit 40. The substrate 100 is disposed over the stage 10. The stage 10 is a floatation stage (a floatation unit) that floats (i.e., levitates) the substrate 100 by ejecting air. The stage 10 ejects gas toward the substrate 100 from below the substrate 100. Therefore, the substrate 100 is conveyed in the X-axis positive direction in a state in which a minute air gap is formed between the stage 10 and the substrate 100.

The annealing optical system 20 is an optical system for irradiating the silicon film 101 with laser light L1 in order to crystallize the amorphous silicon film 101a. The annealing optical system 20 includes a mirror 22 and a projection lens 23. The annealing optical system 20 functions as an optical system for guiding the laser light L1 to the substrate 100.

The annealing optical system 20 is disposed above the substrate 100 (on the Z-axis positive side of the substrate 100). The laser light source 21 is a pulsed laser light source and generates pulsed laser light. The laser light source 21 is, for example, an excimer laser light source that emits excimer laser light having a center wavelength of 308 nm. Further, the laser light source 21 emits pulsed laser light L1. The laser light source 21 emits laser light L1 toward the mirror 22.

The mirror 22 and the projection lens 23 are disposed above the substrate 100. The mirror 22 is, for example, a dichroic mirror that selectively lets light pass therethrough according to the wavelength of the light. The mirror 22 reflects the laser light L1.

The laser light L1 is reflected by the mirror 22 and enters the projection lens 23. The projection lens 23 includes a plurality of lens for projecting the laser light L1 onto the substrate 100, i.e., onto the silicon film 101.

The projection lens 23 concentrates the laser light L1 over the substrate 100. The laser light L1 forms a linear irradiation region over the substrate 100. That is, over the substrate 100, the laser light L1 forms a line beam along the Y-direction (also referred to as a first direction). That is, the laser light L1 concentrated over the substrate 100 forms a linear irradiation region whose longitudinal direction (long-axis direction) is parallel to the Y-direction and whose lateral direction (short-axis direction) is parallel to the X-direction. Further, the silicon film 101 is irradiated with the laser light L1 while the substrate 100 is conveyed in a conveying direction (also referred to as a second direction). In this example, the conveying direction is parallel to the X-direction. In this way, it is possible to apply the laser light L1 to a belt-like region whose width corresponds to the length of the irradiation region in the Y-direction.

As described above, the annealing optical system 20 guides the laser light L1 emitted from the laser light source 21 to the substrate 100. The amorphous silicon film 101a is crystalized by the irradiation of the laser light L1. The silicon film 101 is irradiated with the laser light L1 while the part in the substrate 100 to which the laser light L1 is applied is changed. A uniform polysilicon film 101b is formed over the substrate 100 by conveying the substrate 100 in the X-axis positive direction by the conveying mechanism of the stage 10. Needless to say, the optical system such as the projection lens may be moved instead of conveying the substrate 100. That is, any configuration or the like may be used as long as the irradiation region is scanned by the laser light L1 by moving the substrate 100 and the annealing optical system 20 relative to each other.

Further, the detection unit 30 is disposed over the substrate 100. The detection unit 30 is provided in order to photograph (i.e., take an image of) the crystallized polysilicon film 101b. The configuration of the detection unit 30 will be described later.

The control unit 40 receives the result of the photographing (i.e., the image-taking) performed by the detection unit 30. The silicon film 101 formed over the substrate 100 has been crystallized by the laser light L1. The control unit 40 evaluates the crystalline state of the silicon film 101 based on the result of the photographing by the detector 32. The control unit 40 adjusts the output of the laser light source 21 based on the result of the evaluation. For example, when there are variations in the crystalline state, the control unit 40 increases the output power of the laser light source 21. Alternatively, the control unit 40 may control the conveying speed of the substrate 100 according to the evaluation result.

Figure 2:
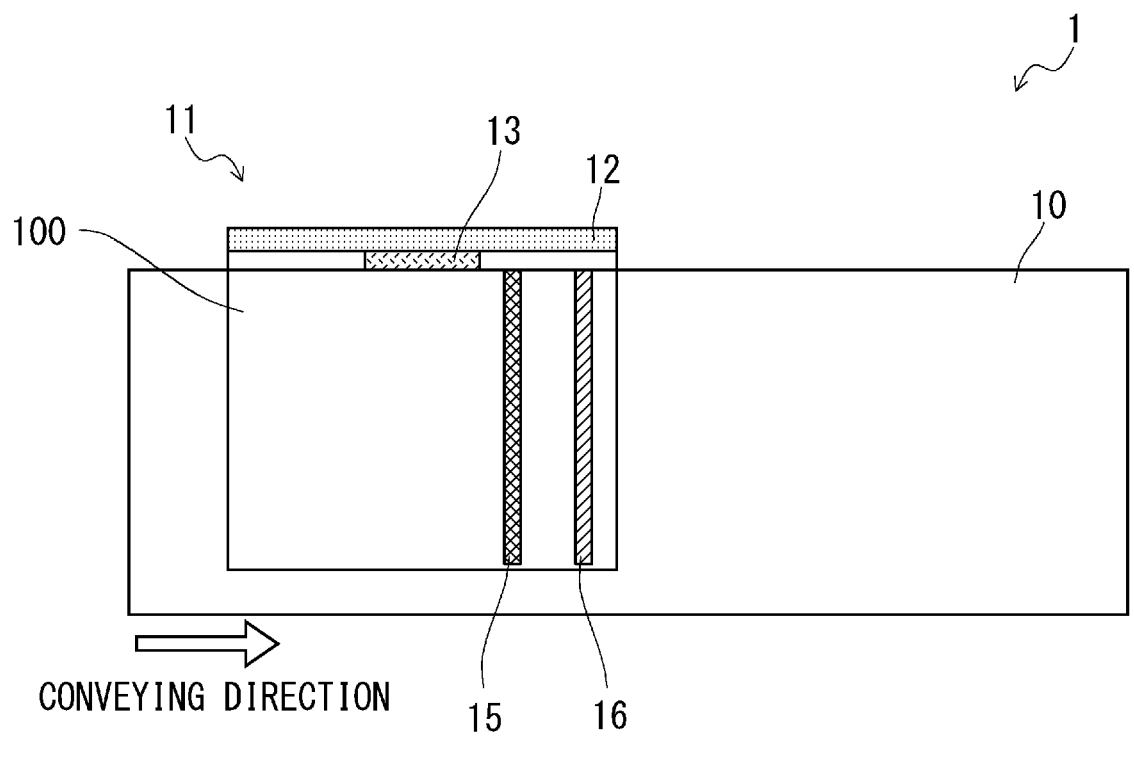
FIG. 2 is a plan view schematically showing a conveying mechanism of the laser annealing apparatus.

Next, the conveying mechanism for conveying the substrate 100 will be described with reference to FIG. 2. FIG. 2 is a plan view schematically showing a configuration for conveying the substrate 100. As described above, the substrate 100 is disposed over the stage 10. A conveyance unit 11 is disposed on the Y-axis positive side of the stage 10.

The stage 10 is a floatation stage that floats (i.e., levitates) the substrate 100 by ejecting gas. The stage 10 is configured so that gas is ejected from the surface of the stage 10. The gas ejected from the surface of the stage 10 is blown onto the lower surface (i.e., underside) of the substrate 100, so that the substrate 100 is floated. When the substrate 100 is conveyed, the stage 10 adjusts a floating height of the substrate 100 by adjusting the amount of ejected gas.

The end of the substrate 100 on the Y-axis positive side protrudes beyond the stage 10. The conveyance unit 11 conveys the floating substrate 100 in the conveying direction (in the X-axis positive direction). The conveyance unit 11 includes a holding mechanism 12 and a moving mechanism 13. The holding mechanism 12 holds the substrate 100. For example, the holding mechanism 12 can be formed by using a vacuum sucking mechanism including a porous element. Alternatively, the holding mechanism 12 may be formed of a metal member having air-intake holes. Further, the holding mechanism 12 may be formed by using a resin-based material such as PEEK (polyether ether ketone) material. The holding mechanism 12 (the vacuum sucking mechanism) is connected to an exhaust port (not shown) and the exhaust port is connected to an ejector, a vacuum pump, or the like. Therefore, since a negative pressure for sucking gas acts in the holding mechanism 12, the substrate 100 can be held by using the holding mechanism 12.

In this embodiment, the holding mechanism 12 holds the substrate 100 by sucking the surface (the upper surface) of the substrate 100 opposite to the surface (the lower surface (i.e., the underside)) thereof that is irradiated with laser light, i.e., by sucking the surface of the substrate 100 opposed to the stage 10. Further, the holding mechanism 12 holds the end of the substrate 100 in the Y-axis positive direction (i.e., the end of the substrate 100 in the direction perpendicular to the conveying direction thereof).

The moving mechanism 13 provided in the conveyance unit 11 is connected to the holding mechanism 12. The moving mechanism 13 is configured so as to be able to move the holding mechanism 12 in the conveying direction (in the x-direction). The conveyance unit 11 (the holding mechanism 12 and the moving mechanism 13) is provided near the end of the stage 10 in the Y-axis positive direction. Further, while the holding mechanism 12 holds the substrate 100, the moving mechanism 13 moves in the conveying direction, so that the substrate 100 is conveyed.

For example, the moving mechanism 13 is configured to slide the end of the stage 10 in the Y-axis positive direction along the X-axis positive direction. As the moving mechanism 13 slides the end of the stage 10 along the X-axis positive direction, the substrate 100 is conveyed along the X-direction. Note that it is possible control the conveying speed of the substrate 100 by controlling the moving speed of the moving mechanism 13. The moving mechanism 13 includes, for example, an actuator such as a motor, a liner guide mechanism, an air bearing, and the like (not shown).

As described above, the substrate 100 is irradiated with laser light. In FIG. 2, an irradiation region 15 irradiated with the laser light L1 has a linear shape. The irradiation region 15 has a linear shape whose longitudinal direction is parallel to the Y-direction.

Further, a detection region 16 where reflected light is detected by the detection unit 30 is formed on the X-axis positive side of the irradiation region 15. The detection region 16 is a linear region whose longitudinal direction is parallel to the Y-direction. The detection region 16 corresponds to the field of view of the detector of the detection unit 30. That is, the detector of the detection unit 30 photographs (i.e., takes an image of) the substrate 100 by detecting reflected light coming from the detection region 16. Since the substrate 100 is conveyed in the X-direction, almost the entire surface of the substrate 100 can be photographed.

Further, the detection region 16 is disposed near the irradiation region 15. That is, the irradiation region 15 and the detection region 16 are arranged with a short distance therebetween in the X-direction. Therefore, it is possible to photograph a part of the substrate 100 that has been annealed by laser light L1 in the middle of the annealing process. Therefore, the control unit 40 can quickly reduce the variations in the crystalline state.

Figure 3:
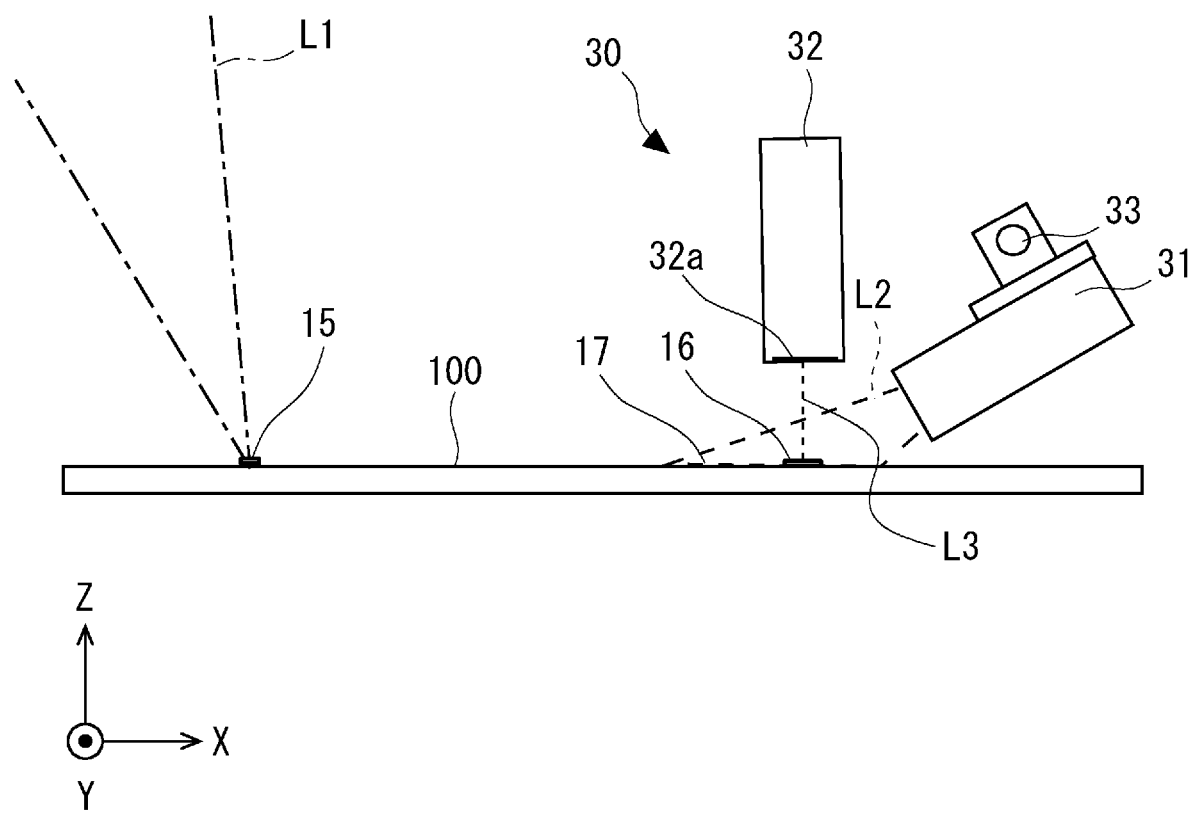
FIG. 3 is an XZ-plane view showing the position of a detection unit with respect to a substrate.
Figure 4:
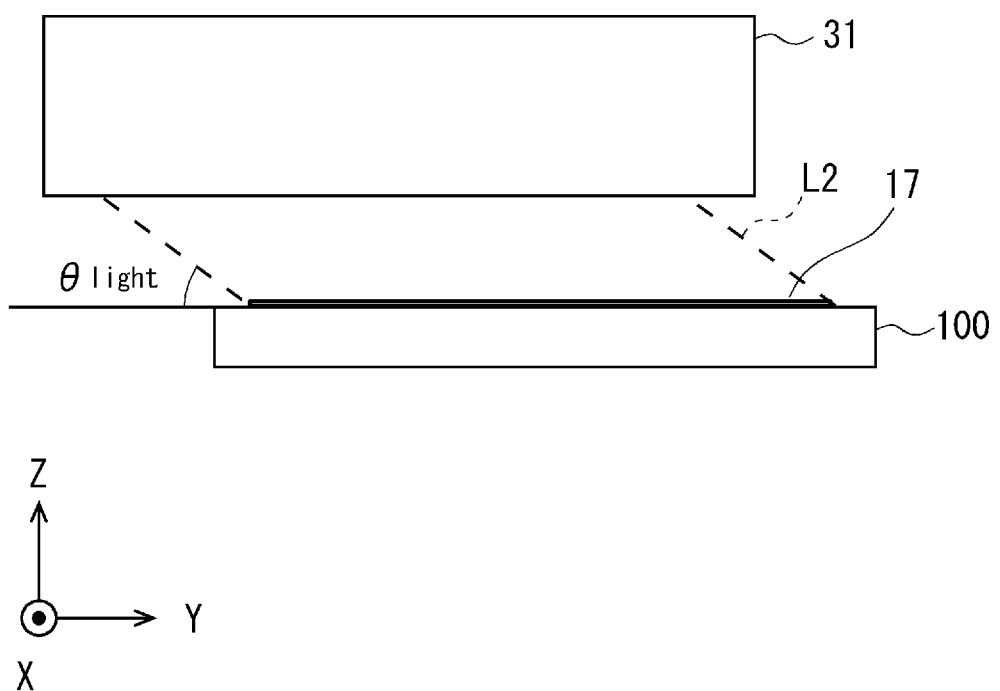
FIG. 4 is a YZ-plane view showing the position of an illumination light source with respect to the substrate.
Figure 5:
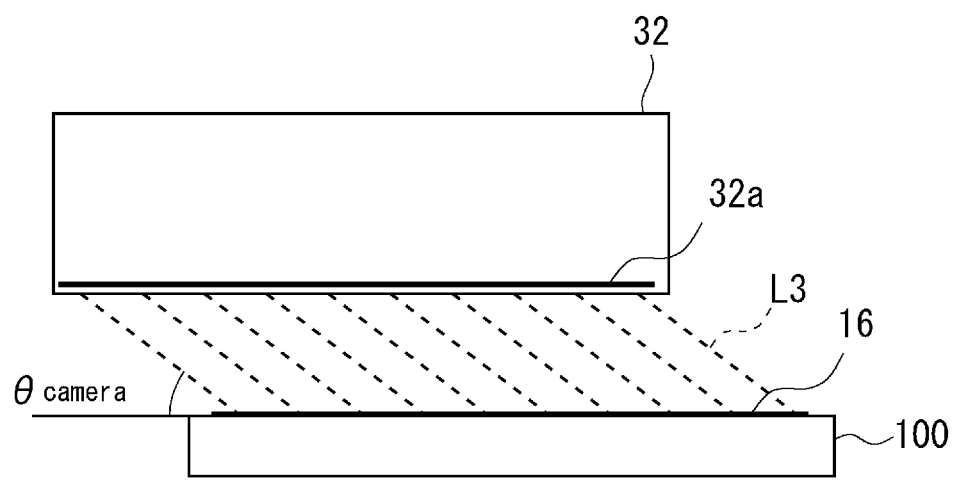
FIG. 5 is a YZ-plane view showing the position of a detector with respect to the substrate.
Figure 5:
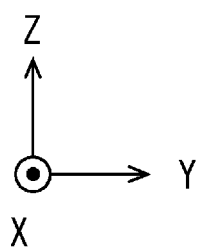

The configuration of the detection unit 30 will be described with reference to FIGS. 3 to 5. FIG. 3 is a side view showing the position of the detection unit 30 with respect to the substrate 100. FIG. 4 is a front view showing the position of an illumination light source 31 of the detection unit 30. FIG. 5 is a front view showing the position of the detector 32 of the detection unit 30. FIG. 3 is an XZ-plane view, and FIGS. 4 and 5 are YZ-plane views. In FIGS. 3 to 5, illustration of the silicon film 101 formed over the substrate 100 is omitted. The detection unit 30 includes the illumination light source 31 and the detector 32.

The illumination light source 31 is disposed above the substrate 100 and generates illumination light L2 for illuminating the substrate 100. The illumination light source 31 is a linear illumination light source, and forms an illumination region 17 whose longitudinal direction is parallel to the Y-direction. The illumination light source 31 is, for example, an LED illumination apparatus including a plurality of LEDs (Light Emitting Diodes). The illumination light L2 uniformly illuminates the entire detection region 16 shown in FIG. 2. The illumination light L2 may be white light, or may be monochromatic light emitted from a laser device or a monochromatic LED(s). In this case, the wavelength of the illumination light L2 may be about 450 nm.

The illumination light source 31 has a lens array composed of a plurality of lenses corresponding to a plurality of LEDs, and illuminates the substrate 100 in an oblique direction. The optical axis of the illumination light L2 emitted from the illumination light source 31 is inclined from the Z-direction. The illumination light source 31 emits the illumination light L2 in a direction obliquely inclined with respect to the upper surface of the substrate 100. As the illumination light source 31, for example, SKLC series manufactured by SHIBASAKI Inc. may be used.

The detector 32 is disposed above the substrate 100. The detector 32 is positioned in a place that is deviated from that of the illumination light source 31 on the X-axis negative side thereof. The detector 32 detects illumination light reflected by the polysilicon film 101b. The illumination light that has been reflected by the substrate 100 and travels toward the detector 32 is referred to as detection light L3. The detector 32 detects the detection light L3 coming from the illumination region 17 illuminated by the illumination light L2.

The detector 32 is a line camera (a line sensor) including a plurality of pixels. That is, a plurality of pixels are arranged in one row along the Y-direction on a photographing surface 32a of the detector 32. Note that the photographing surface 32a is parallel to the XY-plane and faces downward. Further, the detector 32 may include a lens array composed of a plurality of lenses corresponding to respective pixels.

The field of view of the detector 32 constitutes the linear detection region 16 along the Y-direction as shown in FIG. 2. The detector 32 detects detection light L3 reflected in an oblique direction by the substrate 100. The detector 32 photographs the substrate 100 by using the upper surface of the substrate 100 as a focus plane (an in-focus plane). The amount of detection light L3 detected by the detector 32 changes according to the crystalline state of the substrate 100. Therefore, the control unit 40 can evaluate the crystalline state based on the photograph image of the substrate 100 taken by the detector 32.

Further, the illumination light source 31 is attached to a rotating mechanism 33. The rotating mechanism 33 rotatably holds the illumination light source 31. The rotation axis of the rotating mechanism 33 is parallel to the Y-direction. That is, the rotating mechanism 33 rotates the illumination light source 31 about the Y-axis. In this way, it is possible to adjust the direction in which the illumination light L2 is incident on the substrate 100. The rotating mechanism 33 rotates the illumination light source 31, so that the angle of the optical axis of the illumination light L2 is changed.

The direction in which the illumination light L2 is incident on the substrate 100 (hereinafter, referred to as a third direction) and the direction in which the reflected light detected by the detector 32 is reflected (hereinafter, referred to as a fourth direction) will be described in detail. The third direction is the direction in which the illumination light L2 travels near the substrate 100. The third direction is the direction in which the illumination light L2 incident on the substrate 100. That is, over the upper surface of the substrate 100, the third direction is the direction of the optical axis (the central axis), from the illumination light source 31 toward the substrate 100, of the illumination light optical system. The illumination light L2 is incident on the substrate 100 along the third direction. The illumination light source 31 is obliquely disposed so that the illumination light L2 is incident on the substrate 100 along the third direction.

In the YZ-plane view (i.e., as viewed in the direction perpendicular to the YZ-plane), the third direction is oblique with respect to the upper surface of the substrate 100. In the YZ-plane view, the third direction is inclined from the Z-direction. Therefore, the illumination region 17 of the substrate 100 is deviated from the region directly below the illumination light source 31 in the Y-axis positive direction. The angle between the Y-direction and the third direction in the XY-plane view (i.e., as viewed in the direction perpendicular to the XY-plane) is represented by $\theta_{light}$. The angle $\theta_{light}$ may be, for example, from 20° to 30°.

The illumination light L2 is obliquely incident on the substrate 100. Further, in the XZ-plane view (i.e., as viewed in the direction perpendicular to the XZ-plane), the third direction is inclined from the Z-direction. The illumination region 17 of the substrate 100 is deviated from the region directly below the illumination light source 31 in the X-direction.

The detection light L3 reflected in the fourth direction by the substrate 100 detector 32 is detected by the detector 32. The fourth direction is the direction in which the reflected light travels toward the detector over the upper surface of the substrate 100 (i.e., over the polysilicon film 101b). Therefore, the detection light L3, which travels along the fourth direction, is detected by the detector 32. For example, the fourth direction is the direction of the optical axis of the image-forming optical system of the detector 32. The detection light L3 is incident on the detector 32 along the fourth direction. The detector 32 detects the detection light L3 reflected in the fourth direction by the substrate 100. The detector 32 is positioned so as to detect the detection light L3 reflected in the fourth direction by the substrate 100.

In the YZ-plane view, the fourth direction is oblique with respect to the upper surface of the substrate 100. In the YZ-plane view, the fourth direction is inclined from the Z-direction. Therefore, the detection region 16 of the substrate 100 is deviated from the region directly below the detector 32 in the Y-axis positive direction. The angle between the Y-direction and the fourth direction in the XY-plane view is represented by $\theta_{camera}$. The angle $\theta_{camera}$ may be, for example, about 70°.

Although the photographing surface 32a of the detector 32 is parallel to the upper surface (the focus plane) of the substrate 100, the detection light L3 is a light beam that is obliquely incident on the photographing surface 32a of the detector 32. In the XZ-plane view, the fourth direction is parallel to the Z-direction. In the X-direction, the detection region 16 of the substrate 100 coincides with the region directly below the detector 32. Note that, in the XZ-plane view, the fourth direction may be inclined from the Z-direction.

The amount of the detection light L3 detected by the detector 32 changes according to the angles $\theta_{light}$ and $\theta_{camera}$. Specifically, the detection light L3 coming from the polysilicon film 101b interferes with each other, so that the detection result changes. Note that the angles $\theta_{light}$ and $\theta_{camera}$ satisfy a relational expression according to which interference light likely to occur. Therefore, it is possible accurately evaluate the variations in the crystalline state.

Figure 6:
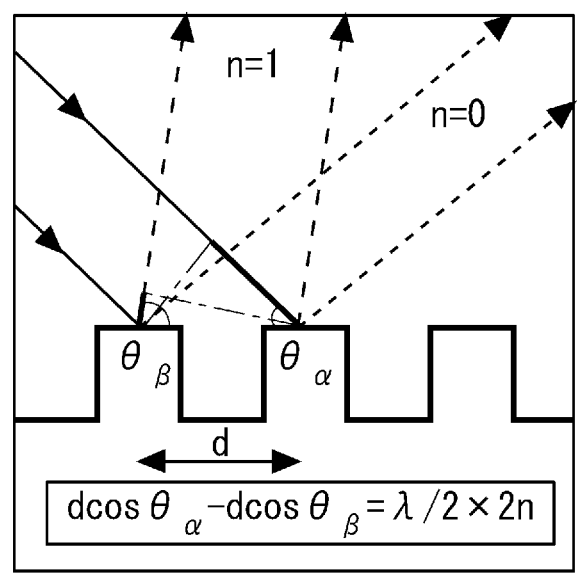
FIG. 6 is a diagram for explaining a diffraction condition.

FIG. 6 is a diagram for explaining a relational expression according to which interference light occurs. FIG. 6 shows a reflection-type diffraction grating in which grooves are formed in the surface of a substrate. The grooves are formed along the direction perpendicular to the surface of the paper. The period of projections/recesses of the grooves is represented by d, and the wavelength of light is represented by λ. The angle of the light incident on the top surface of the projection is represented by $\theta\alpha$, and the angle of the detection light is represented by $\theta_\beta$. Interference light is observed when a relation expressed by the below-shown Expression (1) is satisfied.

$$d_{cos}\theta_\alpha - d_{cos}\theta_\beta = (\mu/2) \times 2n \qquad (1)$$

Note that n is an integer equal to or larger than zero. The appearance of unevenness (i.e., how unevenness is observed) changes depending on the fourth direction (the observing direction). That is, when the angles $\theta_\alpha$ and $\theta_\beta$ satisfy the above-shown relation, lights are in phase and thereby are intensified by each other. Therefore, it is possible to accurately evaluate the variations among the sizes of crystals by setting the third and fourth directions to predetermined angles.

Figure 7:
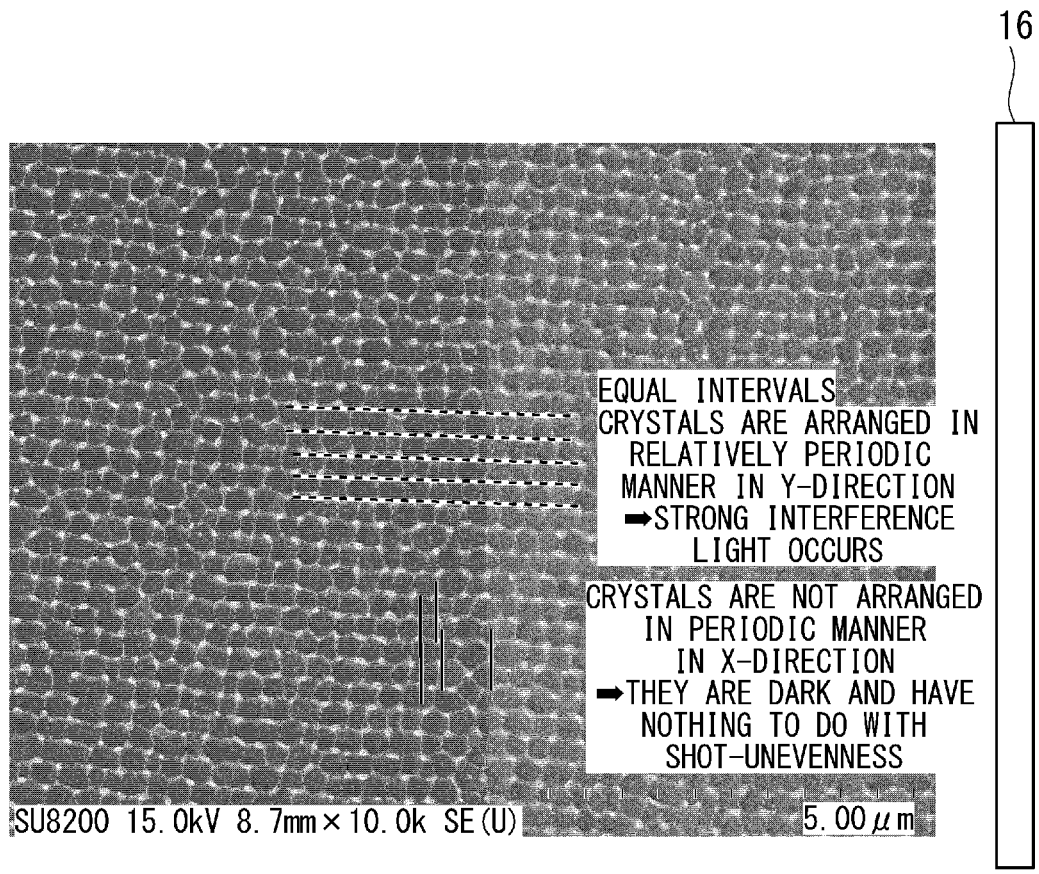
FIG. 7 shows an SEM photograph of a polysilicon film.
Figure 7:
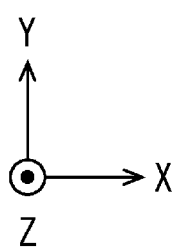

FIG. 7 shows an SEM photograph of a crystallized silicon film 101. As described above, the laser light L1 forms the linear irradiation region 15 along the Y-direction over the substrate 100. Further, the laser light L1 is pulsed light and the substrate 100 is conveyed in the X-direction.

The variations among the crystal sizes in the Y-direction are relatively small, and those in the X-direction are relatively large. That is, since the crystals are regularly arranged at equal intervals in the Y-direction, the crystal sizes are highly uniform. Since the crystals are uniformly arranged in the Y-direction, the interference light tends to be intensified. Meanwhile, since the arrangement of the crystals in the X-direction is poor, the interference light tends to be weakened.

Therefore, in this embodiment, the third and fourth directions are inclined from the Z-direction in the YZ-plane view. In this way, it is possible detect the interference light which has a strong correlation with the unevenness in the crystalline state. That is, when the crystal sizes are not uniform, detection lights L3 are not in phase and are not intensified by each other. In other words, the amount of the detection light L3 widely changes according to the variations among the crystal sizes. Therefore, it is possible to accurately evaluate the variations in the crystalline state by obliquely disposing the illumination light source 31 and the detector 32. It is possible to correctly evaluate the unevenness of the irradiation of the laser light L1. For example, it is possible to accurately evaluate variations among the pulses of the laser light L1.

Therefore, it is possible to determine the optimized energy density (OED) of the laser light L1 during the laser annealing process. Further, the control unit 40 determines the output of the laser light source 21 so that the optimized energy density is achieved. In this way, it is possible to anneal the silicon film 101 at the optimized energy density, and thereby to improve the productivity.

The crystal size corresponds to the period d of grooves in the Expression (1). The angles $\theta_{light}$ and $\theta_{camera}$ at which interference light is likely to occur are set according to the crystal size in the Y-direction. That is, the illumination light source 31 and the detector 32 are disposed at an angle at which reflected lights coming from neighboring crystals become in phase and are intensified by each other. Note that the angles $\theta_{light}$ and $\theta_{camera}$ are preferably set so that interference light other than that in zero order is detected. For example, the detector 32 and the illumination light source 31 are disposed so that interference light in ±first orders (n=±1) and interference light in ±second orders (n=±2) are detected.

Although the fourth direction is determined by the angle at which the detector 32 is positioned in the above description, the fourth direction may be determined (i.e., set) by providing an optical element such as a mirror between the substrate 100 and the detector 32. Similarly, although the third direction is determined by the angle at which the illumination light source 31 is positioned, the third direction may be determined by providing an optical element such as a mirror between the substrate 100 and the illumination light source 31.

As described above, the illumination light source 31 generates illumination light L2 for illuminating the substrate 100 along the third direction. The detector 32 detects detection light L3 reflected in the fourth direction by the substrate 100 illuminated by the illumination light L2 so as to photograph an annealed part of the substrate 100 in the linear field of view along the Y-direction. In the YZ-plane view, the third direction is inclined from the Z-direction (the vertical direction) and the fourth direction is also inclined from the Z-direction (the vertical direction). In this way, it is possible to accurately evaluate the unevenness in the crystalline state.

The field of view of the detector 32 is preferably wider than the irradiation region 15 irradiated by the laser light. In this way, it is possible to evaluate the crystalline state of the entire annealed part of the substrate 100. Further, although the detection region 16 of the detector 32 and the irradiation region 15 cover almost the whole substrate 100 in the Y-direction in FIG. 2, they may cover only a part of the substrate 100. In this case, the substrate 100 may be conveyed in the X-direction twice or more times while shifting the position thereof in the Y-direction every time the substrate 100 has been conveyed in the X-direction.

Note that although the conveyance unit 11 conveys the substrate 100 in the X-direction orthogonal to the Y-direction, the conveying direction does not have to be the direction exactly perpendicular to the Y-direction. That is, the conveying direction does not have to be the direction exactly perpendicular to the Y-direction as long as the conveying direction intersects the Y-direction. Further, the material to be annealed by the laser light L1 is not limited to the silicon film.

In this embodiment, the stage 10 is a floatation stage that floats (i.e., levitates) the substrate 100. The moving mechanism moves the substrate 100 floating over the floatation stage along the X-direction. In this way, it is possible to prevent reflected light reflected by the surface of the stage 10 from being detected, and thereby to accurately evaluate the crystalline state.

In a laser annealing method according to this embodiment, laser light L1 is generated by using the laser light source 21. The laser light L1 is guided to the substrate 100 so as to form a linear irradiation region 15 along the Y-direction over the substrate 100 in a top view (i.e., as viewed from above). The position of the irradiation region 15 with respect to the substrate 100 is changed along the X-direction intersecting the Y-direction in the top view. Illumination light L2 for illuminating the substrate 100 along the third direction is generated by using the illumination light source 31. Detection light L3 reflected in the fourth direction by the substrate 100 illuminated by the illumination light L2 is detected by the detector 32 so that an annealed part of the substrate 100 is photographed in a linear field of view along the Y-direction. In the YZ-plane view, the third direction is inclined from the Z-direction. In the YZ-plane view, the fourth direction is inclined from the Z-direction. In this way, it is possible to accurately evaluate the unevenness of the irradiation.

(Organic EL display)

A semiconductor device having the above-described polysilicon film is suitable for a thin film transistor (TFT) array substrate used for an organic electro-luminescence (EL) display. That is, the polysilicon film is used as a semiconductor layer having a source region, a channel region, and a drain region of a TFT.

Figure 8:
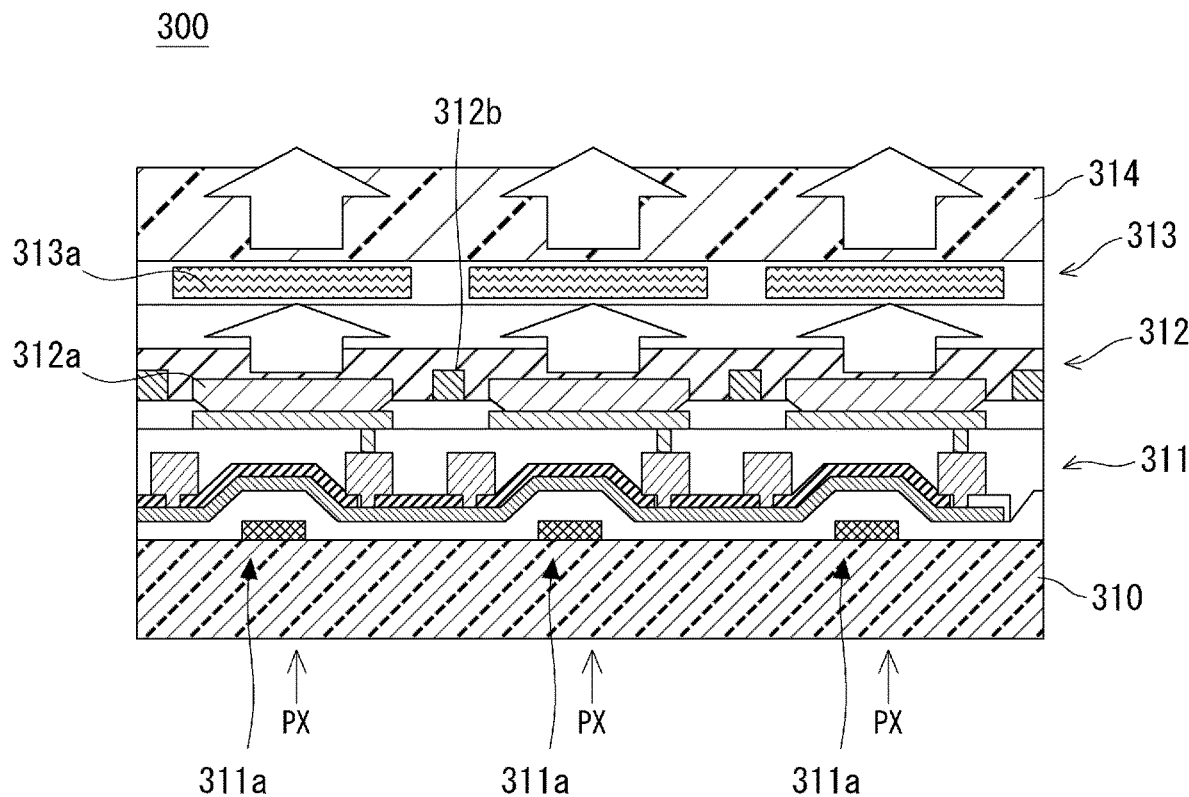
FIG. 8 is a simplified cross-sectional view of a configuration of an organic EL (Electro-Luminescent) display.

Hereinafter, a case in which a semiconductor device according to the present embodiment is used for an organic EL display is described. FIG. 8 is a cross-sectional view of a pixel circuit of an organic EL display device illustrated in a simplified manner. The organic EL display device 300 shown in FIG. 8 is an active-matrix-type display device in which a TFT is disposed in each pixel PX.

The organic EL display device 300 includes a substrate 310, a TFT layer 311, an organic layer 312, a color filter layer 313, and a sealing substrate 314. FIG. 8 shows a top emission-type organic EL display device, in which the sealing substrate 314 side is located on the viewing side. Note that the following description is given to show an example of a configuration of an organic EL display device and this embodiment is not limited to the below-described configuration. For example, a semiconductor device according to this embodiment may be used for a bottom-emission-type organic EL display device.

The substrate 310 is a glass substrate or a metal substrate. The TFT layer 311 is provided over the substrate 310. The TFT layer 311 includes TFTs 311a disposed in the respective pixels PX. Further, the TFT layer 311 includes wiring lines (not shown) connected to the TFTs 311a, and the like. The TFTs 311a, the wiring lines, and the like constitute pixel circuits.

The organic layer 312 is provided over the TFT layer 311. The organic layer 312 includes an organic EL light-emitting element 312a disposed in each pixel PX. The organic EL light-emitting element 312a has, for example, a laminated structure in which an anode, a hole injection layer, a hole transport layer, a light-emitting layer, an electron transport layer, an electron injection layer, and a cathode are laminated. In the case of the top emission type, the anode is a metal electrode and the cathode is a transparent conductive film made of ITO (Indium Tin Oxide) or the like. Further, in the organic layer 312, separation walls 312b for separating organic EL light-emitting elements 312a are provided between pixels PX.

The color filter layer 313 is provided over the organic layer 312. The color filter layer 313 includes color filters 313a for performing color displaying. That is, in each pixel PX, a resin layer colored in R (red), G (green), or B (blue) is provided as the color filter 313a. When white light emitted from the organic layer 312 passes through the color filters 313a, the white light is converted into light having RGB colors. Note that in the case of a three-color system in which organic EL light-emitting elements capable of emitting each color of RGB are provided in the organic layer 312, the color filter layer 313 may be unnecessary.

The sealing substrate 314 is provided over the color filter layer 313. The sealing substrate 314 is a transparent substrate such as a glass substrate and is provided to prevent deterioration of the organic EL light-emitting elements of the organic layer 312.

Electric currents flowing through the organic EL light-emitting elements 312a of the organic layer 312 are changed by display signals supplied to the pixel circuits. Therefore, it is possible to control an amount of light emitted in each pixel PX by supplying a display signal corresponding to a display image to each pixel PX. As a result, it is possible to display a desired image.

In an active matrix display device such as an organic EL display, one pixel PX is provided with one or more TFTs (for example, a switching TFT and a driving TFT). Then, the TFT of each pixel PX is provided with a semiconductor layer having a source region, a channel region, and a drain region. The polysilicon film according to the present embodiment is suitable for a semiconductor layer of a TFT. That is, by using the polysilicon film manufactured by the above manufacturing method for a semiconductor layer of a TFT array substrate, it is possible to suppress in-plane ununiformity which is the TFT characteristics. Thus, it is possible to manufacture a display device having an excellent display characteristic with high productivity.

(Manufacturing Method for Semiconductor Device)

A manufacturing method for a semiconductor device using the ELA apparatus according to the present embodiment is suitable for manufacturing a TFT array substrate. A method for manufacturing a semiconductor device including a TFT will be described with reference to FIGS. 9 to 16. FIGS. 9 to 16 are cross-sectional views showing processes for manufacturing a semiconductor device. In the following description, a manufacturing method for a semiconductor device having an inverted staggered TFT is described.

Figure 9:
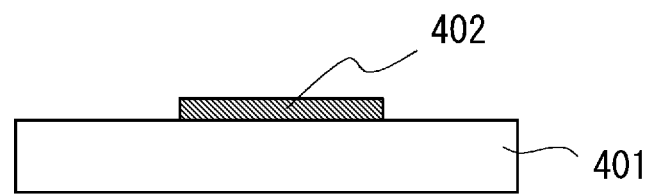
FIG. 9 is a cross-sectional view showing a process in a method for manufacturing a semiconductor device according to this embodiment.

First, as shown in FIG. 9, a gate electrode 402 is formed over a glass substrate 401. Note that, the glass substrate 401 corresponds to the above substrate 100. As the gate electrode 402, for example, a metal thin film containing aluminium can be used. A metal thin film is formed on the glass substrate 401 by a sputtering method or a deposition method. Then, the metal thin film is patterned by photolithography to form the gate electrode 402. In a photolithography method, processing, such as resist coating, exposure, developing, etching, and resist stripping, is performed. Note that, various types of wiring may be formed in the same process as the patterning of the gate electrode 402.

Figure 10:
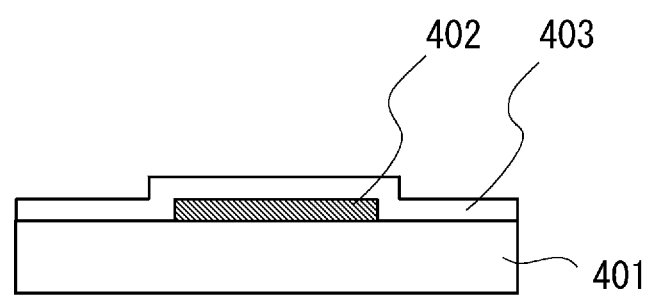
FIG. 10 is a cross-sectional view showing a process in the method for manufacturing the semiconductor device according to this embodiment.
Figure 11:
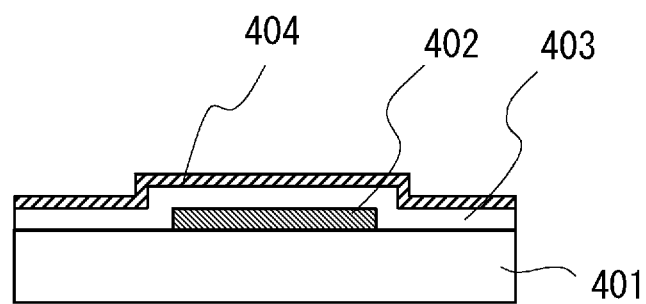
FIG. 11 is a cross-sectional view showing a process in the method for manufacturing the semiconductor device according to this embodiment.

Next, a gate insulating film 402 is formed over the gate electrode 403 as shown in FIG. 10. The gate insulating film 403 is formed so as to cover the gate electrode 402. Then, an amorphous silicon film 404 is formed over the gate insulating film 403 as shown in FIG. 11. The amorphous silicon film 404 is arranged so as to overlap the gate electrode 402 interposing the gate insulating film 403.

The gate insulating film 403 is a silicon nitride film ($SiN_x$) or a silicon oxide film ($SiO_2$ film), or a lamination film thereof, or the like. Specifically, the gate insulating film 403 and the amorphous silicon film 404 are continuously formed by a chemical vapor deposition (CVD) method.

Figure 12:
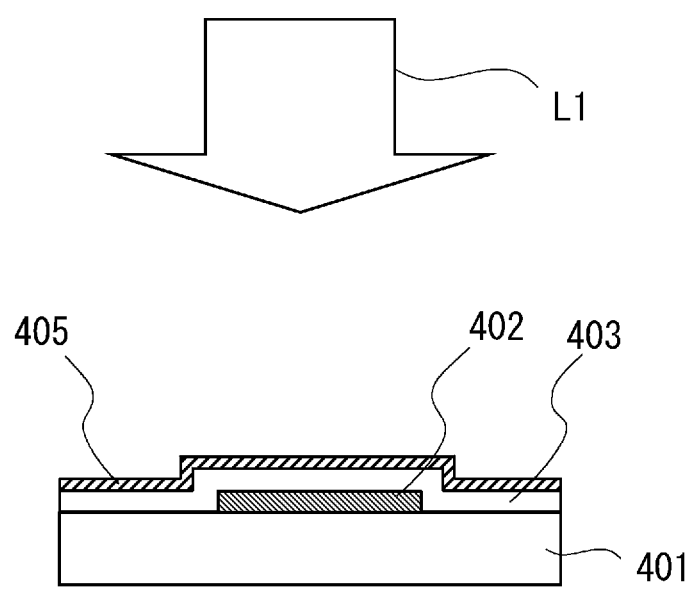
FIG. 12 is a cross-sectional view showing a process in the method for manufacturing the semiconductor device according to this embodiment.

Then, the amorphous silicon film 404 is irradiated with the laser light L1 and a polysilicon film 405 is thereby formed as shown in FIG. 12. That is, the amorphous silicon film 404 is crystallized by the ELA apparatus 1 shown in FIG. 1 and the like. The polysilicon film 405 with silicon crystallized is thereby formed on the gate insulating film 403. The polysilicon film 405 corresponds to the above polysilicon film 101b.

At this time, the polysilicon film 405 is inspected by the inspection method according to the present embodiment. When the polysilicon film 405 does not meet a predetermined criterion, the polysilicon film 405 is irradiated with laser light again. Thus, it is possible to further uniformize the characteristic of the polysilicon film 405. Since the in-plane ununiformity can be suppressed, it is possible to manufacture a display device having an excellent display characteristic with high productivity.

Note that, although not shown, the polysilicon film 405 is patterned by a photolithography method. In addition, impurities may be introduced into the polysilicon film 405 by an ion implantation method or the like.

Figure 13:
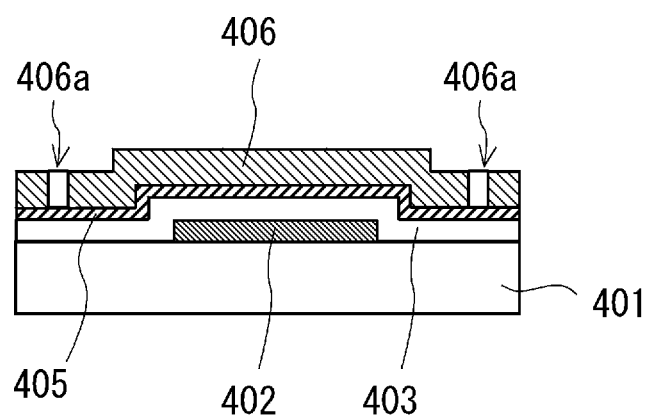
FIG. 13 is a cross-sectional view showing a process in the method for manufacturing the semiconductor device according to this embodiment.

Then, an interlayer insulating film 406 is formed over the polysilicon film 405 as shown in FIG. 13. The interlayer insulating film 406 is provided with contact holes 406a for exposing the polysilicon film 405.

The interlayer insulating film 406 is a silicon nitride film ($SiN_x$) or a silicon oxide film ($SiO_2$ film), or a lamination film thereof, or the like. Specifically, the interlayer insulating film 406 is formed by a chemical vapor deposition (CVD) method. Then, the interlayer insulating film 406 is patterned by a photolithography method to form the contact holes 406a.

Figure 14:
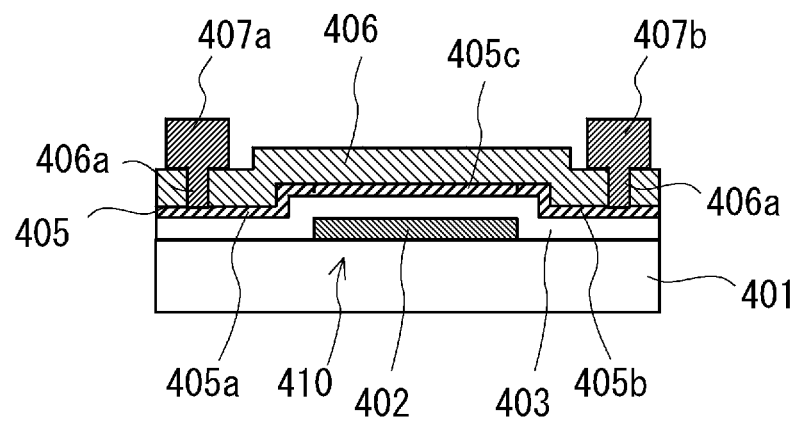
FIG. 14 is a cross-sectional view showing a process in the method for manufacturing the semiconductor device according to this embodiment.

Next, a source electrode 407a and a drain electrode 407b are formed over the interlayer insulating film 406 as shown in FIG. 14. The source electrode 407a and the drain electrode 407b are formed so as to cover the contact holes 406a. That is, the source electrode 407a and the drain electrode 407b are formed from the inside of the contact holes 406a over the interlayer insulating film 406. Thus, the source electrode 407a and the drain electrode 407b are electrically connected to the polysilicon film 405 though the contact holes 406a.

Accordingly, a TFT 410 is formed. The TFT 410 corresponds to the above TFT 311a. The region overlapping the gate electrode 402 in the polysilicon film 405 is a channel region 405c. The source electrode 407a side of the polysilicon film 405 from the channel region 405c is a source region 405a, and the drain electrode 407b side is a drain region 405b.

The source electrode 407a and the drain electrode 407b are formed of a metal thin film containing aluminium. A metal thin film is formed over the interlayer insulating film 406 by a sputtering method or a deposition method. Then, the metal thin film is patterned by photolithography to form the source electrode 407a and the drain electrode 407b. Note that, various types of wiring may be formed in the same process as the patterning of the source electrode 407a and the drain electrode 407b.

Figure 15:
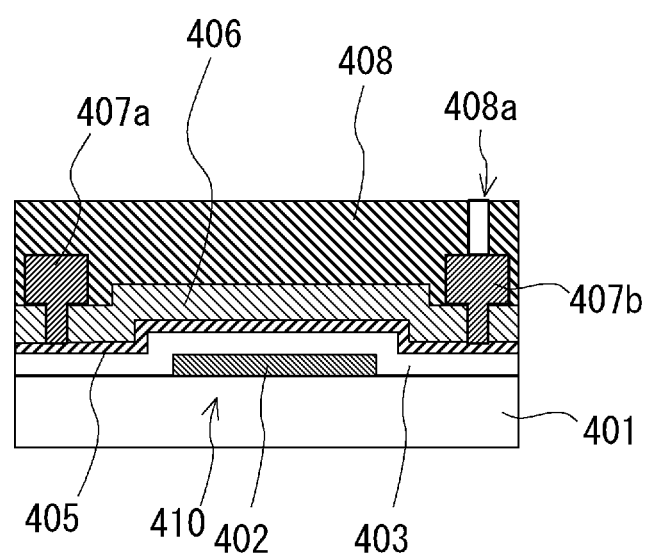
FIG. 15 is a cross-sectional view showing a process in the method for manufacturing the semiconductor device according to this embodiment.

Then, a planarization film 408 is formed over the source electrode 407a and the drain electrode 407b as shown in FIG. 15. The planarization film 408 is formed so as to cover the source electrode 407a and the drain electrode 407b. The planarization film 408 is provided with a contact hole 408a for exposing the drain electrode 407b.

The planarization film 408 is formed of, for example, a photosensitive resin film. A photosensitive resin film is coated over the source electrode 407a and the drain electrode 407b, and exposed and developed. Accordingly, it is possible to pattern the planarization film 408 having the contact hole 408a.

Figure 16:
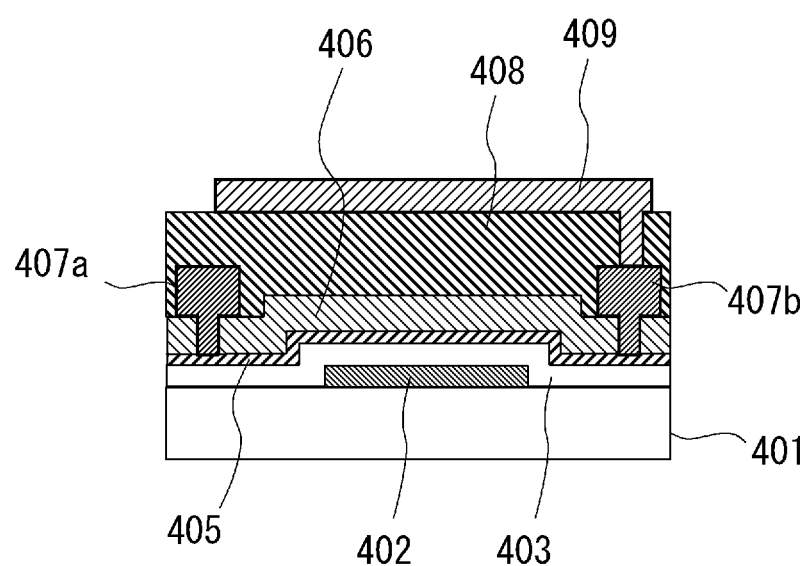
FIG. 16 is a cross-sectional view showing a process in the method for manufacturing the semiconductor device according to this embodiment.

Then, a pixel electrode 409 is formed over the planarization film 408 as shown in FIG. 16. The pixel electrode 409 is formed so as to cover the contact hole 408a. That is, the pixel electrode 409 is formed from the inside of the contact hole 408a to above the planarization film 408. Thus, the pixel electrode 409 is electrically connected to the drain electrode 407b through the contact hole 408a.

The pixel electrode 409 is formed of a transparent conductive film or a metal thin film containing aluminum. A conductive film (a transparent conductive film or a metal thin film) is formed over the planarization film 408 by a sputtering method. Then, the conductive film is patterned by the photolithography method. The pixel electrode 409 is thereby formed over the planarization film 408. In the case of a driving TFT of an organic EL display, the organic EL light emitting device 312a, the color filter (CF) 313a, and the like as shown FIG. 8 are formed on the pixel electrode 409. Note that, in the case of a top-emission type organic EL display, the pixel electrode 409 is formed of a metal thin film containing aluminum or silver which have a high reflectance. In the case of a bottom-emission type organic EL display, the pixel electrode 409 is formed of a transparent conductive film such as ITO.

The processes for manufacturing an inverted staggered TFT have been described. The manufacturing method according to the present embodiment may be applied to manufacture of an inverted staggered TFT. It is obvious that the manufacturing method for a TFT is not limited to a TFT for an organic EL display and can be applied to manufacture of a TFT for a liquid crystal display (LCD).

In addition, it has been described that the laser annealing apparatus according to the present embodiment irradiates an amorphous silicon film with laser light to form a polysilicon film in the above description, but the laser annealing apparatus may irradiate an amorphous silicon film with laser light to form a micro-crystal silicon film. Furthermore, a laser light for performing annealing is not limited to excimer laser. In addition, the method according to the present embodiment can be applied to a laser annealing apparatus that crystallizes thin films other than a silicon film. That is, as long as the laser annealing apparatus irradiates an amorphous film with laser light to form a crystallized film, the method according to the present embodiment can be applied. According to a laser annealing apparatus in accordance with the embodiment, it is possible to properly inspect a substrate with a crystallized film.

The present disclosure is not limited to the above-described embodiments, and various modifications can be made without departing from the spirit and scope of the present disclosure.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A laser annealing method comprising the steps of:
   (a) generating laser light using a laser light source;
   (b) guiding the laser light to a substrate so as to form, over the substrate, a linear irradiation region along a first direction in a top view;
   (c) changing a relative position of the irradiation region with respect to the substrate along a second direction intersecting the first direction in the top view;
   (d) generating illumination light for illuminating the substrate along a third direction by using an illumination light source, the third direction being a direction inclined from a vertical direction as viewed in a direction perpendicular to a plane including the first direction and the vertical direction; and
   (e) detecting, by a detector, a detection light reflected in a fourth direction by the substrate illuminated by the illumination light so as to photograph an annealed part of the substrate in a linear field of view along the first direction, the fourth direction being inclined from the vertical direction as viewed in the direction perpendicular to the plane including the first direction and the vertical direction.

2. The laser annealing method according to claim 1, wherein a field of view of the detector is wider than an irradiation region irradiated with the laser light in the first direction.

3. The laser annealing method according to claim 1, wherein
   the substrate is floated by a floatation stage, and
   the substrate floating over the floatation stage moves along the second direction.

4. The laser annealing method according to claim 1, wherein
   a film formed over the substrate is crystallized by the laser light,
   unevenness of a crystalline state of the film is evaluated based on a result of the photographing by the detector, and
   an output of the laser light source is adjusted based on a result of the evaluation.

5. A method for manufacturing a semiconductor device, comprising the steps of:
   (S1) forming an amorphous film over a substrate; and
   (S2) annealing the amorphous film so that the amorphous film is crystalized and a crystallized film is thereby formed, wherein
   the (S2) annealing comprises the steps of:
   (A) generating laser light using a laser light source;
   (B) guiding the laser light to the substrate so as to form, over the substrate, a linear irradiation region along a first direction in a top view;
   (C) changing a relative position of the irradiation region with respect to the substrate along a second direction intersecting the first direction in the top view;
   (D) generating illumination light for illuminating the substrate along a third direction by using an illumination light source, the third direction being a direction inclined from a vertical direction as viewed in a direction perpendicular to a plane including the first direction and the vertical direction; and
   (E) detecting, by a detector, a detection light reflected in a fourth direction by the substrate illuminated by the illumination light so as to photograph an annealed part of the substrate in a linear field of view along the first direction, the fourth direction being inclined from the vertical direction as viewed in the direction perpendicular to the plane including the first direction and the vertical direction.

6. The method for manufacturing a semiconductor device according to claim 5, wherein a field of view of the detector is wider than an irradiation region irradiated with the laser light in the first direction.

7. The method for manufacturing a semiconductor device according to claim 5, wherein
  the substrate is floated by a floatation stage, and
  the substrate floating over the floatation stage moves along the second direction.

8. The method for manufacturing a semiconductor device according to claim 5, wherein
  a film formed over the substrate is crystallized by the laser light,
  unevenness of a crystalline state of the film is evaluated based on a result of the photographing by the detector, and
  an output of the laser light source is adjusted based on a result of the evaluation.

* * * * *